United States Patent [19]

Valeur

[11] Patent Number: 4,670,810

[45] Date of Patent: Jun. 2, 1987

[54] ZERO-CURRENT A.C. SWITCHING SYSTEM

[75] Inventor: Bjorn E. Valeur, Beverly, Mass.

[73] Assignee: Electronic Instrument & Specialty Corp., Stoneham, Mass.

[21] Appl. No.: 840,065

[22] Filed: Mar. 17, 1986

[51] Int. Cl.⁴ .................. H02H 7/20; H03K 17/08
[52] U.S. Cl. ............................... 361/5; 361/7; 361/187; 361/190; 323/319
[58] Field of Search ............ 361/3, 5, 2, 7, 187, 361/189, 190; 323/319, 235

[56] References Cited

U.S. PATENT DOCUMENTS

| | | | |
|---|---|---|---|
| 3,808,455 | 4/1974 | Leisi | 361/3 |
| 3,946,277 | 3/1976 | Lange et al. | 361/5 |
| 4,245,184 | 1/1981 | Billings et al. | 361/3 |
| 4,306,263 | 12/1981 | Gray et al. | 361/3 |
| 4,356,525 | 10/1982 | Kornrumpf et al. | 361/3 |

OTHER PUBLICATIONS

Ritamaki, Pekka, "Optocoupler is Zero—Crossing Detector and Isolator in Trial Power Control", *Electric Design* 20, (Sep. 27, 1975), p. 104.

*Primary Examiner*—L. T. Hix
*Assistant Examiner*—David Porterfield
*Attorney, Agent, or Firm*—Joseph S. Iandiorio; William E. Noonan

[57] ABSTRACT

A zero-current a.c. switching system is provided for controlling actuation of relay contacts between a power supply and a load. A primary switch selectively energizes the relay to maintain the relay contacts in the closed state. The load current flowing through the relay contacts to the load is sensed. A secondary switch responds to the sensed load current for normally conducting to energize the relay in parallel with the primary switch. The secondary switch ceases conducting each time the load current drops below a predetermined level to cease energizing the relay and open the relay contacts the next time the load current drops below the predetermined level following the opening of the primary switch.

31 Claims, 7 Drawing Figures

ZERO-CURRENT A.C. SWITCHING SYSTEM

FIELD OF INVENTION

This invention relates to an isolated zero-current a.c. switching system for controlling actuation of relay contacts between a power supply and a load.

BACKGROUND OF INVENTION

High-speed switching is required in many general purposes industrial control applications. Typically in such cases reed relays or other suitable relays have been employed to open and close the switch contacts and to provide electrical isolation between the control and power circuits. Relay life is adversely affected, however, by arcing which tends to occur across the contacts as they begin to open. While this problem is reduced somewhat by the use of larger contacts, such contacts operate relatively slowly and are often unsuitable for use in many high-speed applications.

A number of devices have attempted to reduce the arcing problem by measuring a zero-current crossing point of the load current and timing the contacts to begin opening at the next zero-current crossing. In addition to requiring complex and relatively slow timing circuitry these devices often employ large, heavy contacts. As a result they tend to operate much too slowly for use in equipment requiring rapid, for example 1–10 millisecond, switching speeds. Moreover, because these devices predict the subsequent zero-current crossing their operation may be disrupted if the frequency of the power supply changes and the subsequent zero-current crossing is different than predicted.

Certain other devices employ zero-current crossing detection in connection with solid state switches which are connected in the load circuit. Again, these devices tend to be complex and many operate rather slowly. Moreover, they exhibit a certain degree of leakage through the solid state switch and, as a result, do not provide optimum electrical isolation between the power supply and load.

SUMMARY OF INVENTION

It is therefore an object of this invention to provide a zero-current a.c. switching system which reduces contact arcing and increases contact life.

It is a further object of this invention to provide a zero-current a.c. switching system which exhibits a rapid response time.

It is a further object of this invention to provide a zero-current a.c. switching system which provides for effective electrical isolation between the control and load circuits and between the power supply and load circuits.

It is a further object of this invention to provide a zero-current a.c. switching system which does not require complex timing circuitry and is not sensitive to variations in the frequency of the power supply.

It is a further object of this invention to provide a zero-current a.c. switching system which is simple, compact and inexpensive and which may be employed in a wide variety of high-speed switching and control applications.

This invention features a zero-current a.c. switching system for controlling actuation of relay contacts between a power supply and a load which includes means for sensing the load current flowing through the relay contacts to the load. There are primary switching means for selectively energizing the relay to maintain the relay contacts in the closed state, and secondary switching means are responsive to the means for sensing for normally conducting to energize the relay in parallel with the primary switching means. The secondary switching means cease conducting each time the load current drops below a predetermined level to cease energizing the relay and open the relay contacts the next time the load current drops below the predetermined level following the opening of the primary switching means.

In a preferred embodiment the means for sensing may include diode means, responsive to a load current of at least the predetermined level, for providing a drive signal, and LED means, responsive to the drive signal, for emitting radiation to maintain the secondary switching means in the conducting condition. The diode means may include first and second diodes connected in parallel and with reverse polarity. The LED means may include first and second LEDs connected in parallel and with reverse polarity. The secondary switching means may include semiconductor means responsive to the radiation from the LED means for maintaining the conducting condition. The LED means and the semiconductor means may be included in an opto-coupler.

Alternatively, the means for sensing may include LED means which are directly responsive to a load current of at least the predetermined level for emitting radiation to maintain the secondary switching means in the conducting condition. Such LED means may include first and second LEDs connected in parallel and with reverse polarity.

In an alternative embodiment the means for sensing may include means for inducing an output current representative of the load current. Means may be provided which are responsive to the means for inducing for providing an actuating signal. The means for providing an actuating signal may include amplifier means. The secondary switching means may include semiconductor means which are responsive to the actuating signal for maintaining the conducting condition.

The secondary switching means may include semiconductor means, and impedance means may be connected to the secondary switching means for controlling the current conducted therethrough in the conducting condition and for controlling the period of the zero-current cross-over. The primary switching means may include a mechanical or a solid state switch.

The secondary switching means switches repeatedly from a conducting condition to a non-conducting condition at a rate which equals twice the frequency of the load current so that the relay contacts are always ready for virtually instantaneous zero-current switching.

DISCLOSURE OF PREFERRED EMBODIMENT

Other objects, features and advantages will occur from the following description of a preferred embodiment and the accompanying drawings, in which.

Figure 1:
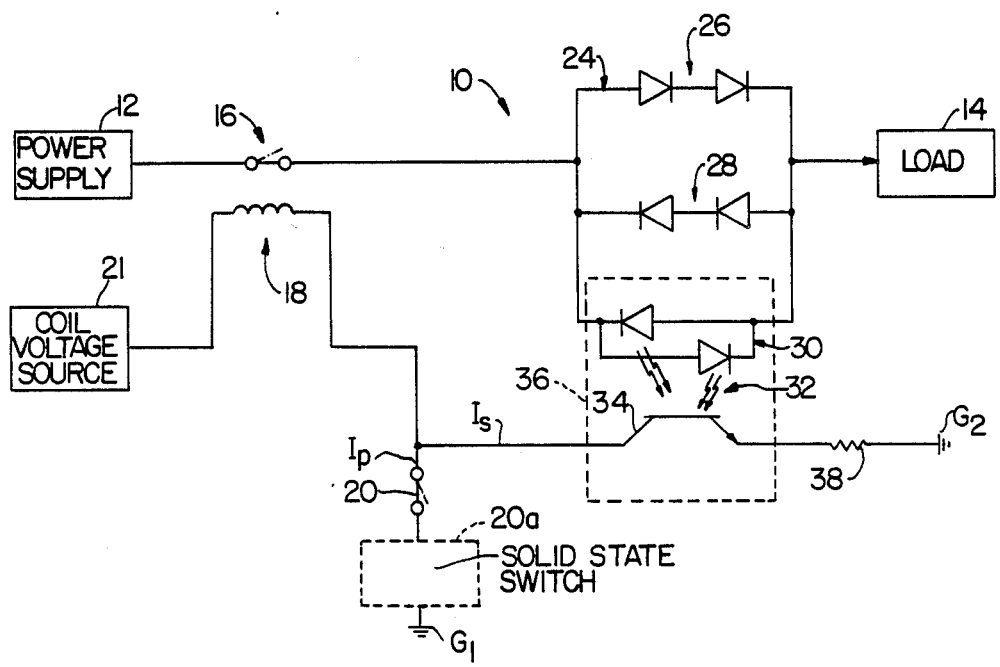
FIG. 1 is a schematic diagram of a preferred zero-current switching system according to this invention.

A zero-current a.c. switching system for controlling actuation of a relay contact between a power supply and a load according to this invention may be accomplished using means such as diode and LED circuitry or an induction coil and amplifier/comparator for sensing the load current flowing through the relay contacts to the load. A primary switch selectively energizes the relay to maintain the relay contacts in the closed state. A secondary switch is responsive to the sensing means for normally conducting to energize the relay in parallel with the primary switch. The secondary switch ceases conducting each time the load current drops below a predetermined level where destructive arcing does not occur, e.g., 20–50 mA. Thus the next time the load current drops below the predetermined level following the opening of the primary switch the relay contacts will open. As used herein, the terms "zero-current" and "zero-current crossing" may refer to any load current level near or at zero which does not produce an appreciable amount of arcing when the relay contacts are opened.

The switching system of this invention should be employed with a relay which is capable of opening its contacts quickly during the short period when the current is below the predetermined level. This typically requires a switching speed of less than approximately 2 milliseconds in a 50 or 60 Hz application, which can be obtained by reed relays and various other types of high-speed relays. The relay is operated by a voltage of, for example, 5 volts.

In one embodiment the load current is sensed by first and second pairs of diodes which are connected in parallel in the load circuit and have reverse polarity. A preferred diode includes the IN4001 or equivalent power diode such as is manufactured by Motorola or Fairchild. Zener diodes may also be employed. Each of the diodes is designed to provide a predetermined voltage drop of 0.7–1.2 volts, for example, 1.2 volts. As long as the alternating current remains above the predetermined level, e.g., 20–50 mA, the diodes provide a drive signal of between 1.4 and 2.4 volts. A pair of LEDs which are connected in parallel with reverse polarity and which typically have an operating threshold of typically 1.2 volts respond to the drive signal provided by the diodes to emit radiation. This radiation strikes the secondary switch, which preferably includes a phototransistor or other semiconductor switch, and causes it to maintain its normally conducting condition. Typically, the LEDs and the semiconductor switch are contained in a single unit known as an opto-isolator or opto-coupler. A preferred opto-isolator is the H11AA1 model provided by Motorola.

At each of the two points in the load current cycle at which the load current drops below the predetermined level, e.g. +20 mA to +50 mA and −20 mA to −50 mA, the diodes cease providing a drive signal. This causes the LEDs to cease emitting radiation and, as a result, the secondary switch is switched to its non-conducting state.

In additional alternative embodiments LEDs capable of operating on the load current may directly respond to the load current so that at the predetermined current level they emit radiation to maintain the secondary switch in the conducting condition. Alternatively, where a constant known AC-RMS load current is required a resistor may be employed to sense the load current and provide an operating signal to the secondary switch. However, when the switching system is employed in applications where the load voltage is unknown or variable, the diode, induction circuit or LED sensing devices, each of which provides when actuated a constant holding signal regardless of the load voltage, are preferred. Although in this embodiment the supply is sinusoidal a.c., the invention will work with pulsating d.c., square waves, or any other system in which the current periodically approaches zero.

The primary switch may include a mechanical or solid state switch. With the primary switch closed, the relay is energized with current passing primarily through the primary switch to ground. This maintains the relay contacts in a closed condition. In the meantime, the secondary switch is repeatedly switched back and forth between a normally conducting and a non-conducting condition each time the load current passes the predetermined level. To open the relay contacts the operator selectively opens the primary switch. As a result, the relay current is now provided solely through the secondary switch to ground provided that switch is in its conducting state. As soon thereafter as the load current drops below its predetermined level the system operates as previously described to switch the secondary switch to its non-conducting state. The relay is de-energized and the relay contacts are permitted to open. The secondary switch remains in the non-conducting condition until the load current passes above the predetermined level during the next half-cycle. For example, the secondary switch will remain in a non-conducting condition during that portion of the load current cycle between +20 mA to +50 mA and −20 mA to −50 mA. The relay contacts should operate rapidly enough to open during this time interval so that arcing is minimized. This switching window may be increased by connecting a resistance between the secondary switch and ground. Such a resistance limits the amount of current conducted through the secondary switch and, as a result, increases the time the secondary switch is in the non-conducting condition.

Because the secondary switch switches repeatedly from the conducting condition to the non-conducting condition at a rate which equals twice the frequency of the load current, the relay contacts are always ready for virtually instantaneous zero-current switching. To open the contacts the operator simply has to open the primary switch; the relay is de-energized and the contacts are opened at the next zero-current crossing. The load current exhibits two zero-current crossings per cycle. Accordingly, a load current with a frequency of, for example, sixty cycles per second has 120 zero-current crossings per second. As a result, switching commences no more than 1/120 of a second following opening of the primary switch. This provides rapid and dependable switching response. Moreover, the system does not depend upon the predicted times of subsequent zero-current crossings. Complex timing circuitry is not required and the switching system is not sensitive to fluctuations in the load frequency. Switching occurs dependably at the first zero-current crossing following the opening of the primary switch.

By employing an opto-isolator, or alternatively an induction sensor, the switching system is effectively electrically isolated from the load circuit. Moreover, because the system does not employ switching circuitry connected between the power supply and load, electrical leakage between the power supply and load is reduced and isolation between those elements is enhanced.

There is shown in FIG. 1 a zero-current a.c. switching system 10 according to this invention which is connected between a power supply 12 and a load 14. The primary switching between power supply 12 and load 14 is accomplished by conventional relay contacts 16 which are operated by coil 18, generally under the control of a primary switch such as either mechanical switch 20 or solid state switch 20a. In normal operation, with switch 20 closed, relay coil current is provided by voltage source 21 through coil 18 and switch 20 to ground G1. This coil current energizes coil 18 to maintain contact 16 in the normally closed condition. If this were the only circuit, when switch 20 is opened the connection to ground G1 would be broken, the current through coil 18 would stop and contacts 16 would open.

However, in order to ensure that the opening of contacts 16 occurs at a zero-current condition, when arcing of the contacts is sharply reduced, system 10 includes means for sensing when the load current has dropped below a predetermined level, e.g., 20-50 mA, virtually a zero-current condition as to arcing problems. Such means for sensing includes diode circuit 24 which includes a first pair of diodes 26 connected in a first direction between power supply 12 and load 14, and a second pair of diodes 28 connected in parallel with diode pair 26 between the power supply and load but having a reverse polarity. As long as the load current in the forward direction is at or above the predetermined level, the diode pair 26 provide a combined voltage drop of between 1.4 and 2.4 volts, for example 2 volts. Similarly, when the load current is above the predetermined level in the reverse direction, diode pair 28 provide a similar combined voltage drop. This voltage drop is applied as a drive signal across a pair of LEDs 30 which are connected in parallel with reverse polarity. The LEDs respond to the drive signal by emitting a light output 32 which strikes a photo-transistor 34. Both LED pair 30 and phototransistor 34 are contained in a single package known as an opto-isolator 36. LEDs 30 and phototransistor 34 may alternatively be purchased and installed as discrete items. Phototransistor 34 is connected between relay coil 18 and ground G2 and provides an alternative path for the relay coil current. A resistor 38 having a value of, for example, 300 ohms may be connected between phototransistor 34 and ground G2. Grounds G1, G2 indicate only a common connection and can in fact be at any suitable voltage level.

In operation, current flows through the load and fluctuates in the normal alternating current fashion. When that current is at or above 20-50 mA, phototransistor 34 is maintained in the conducting condition. As long as switch 20 is closed, current $I_p$ is conducted through relay coil 18 to ground G1 and contacts 16 remain closed. At the same time, essentially no current flows through limiting resistor 38 and phototransistor 34. However, when switch 20 is opened the current $I_p$ ceases flowing and coil current $I_s$ flows only through conducting phototransistor 34 to ground G2. As long as the conducting condition is maintained by phototransistor 34, current $I_s$ maintains coil 18 in an energized state and contacts 16 remain closed.

When the fluctuating a.c. load current subsequently falls below 20-50 mA, e.g. enters its zero crossing region, the voltage across diode circuit 24 drops, and the drive signal is removed from across LED circuit 30. The LEDs cease their emission of radiation 32, and as a result phototransistor 34 switches to a non-conducting condition. The current $I_s$ through coil 18 drops off and is insufficient to hold contacts 16 in their closed state. As a result, contacts 16 open at or near the zero-current condition.

Figure 1A:
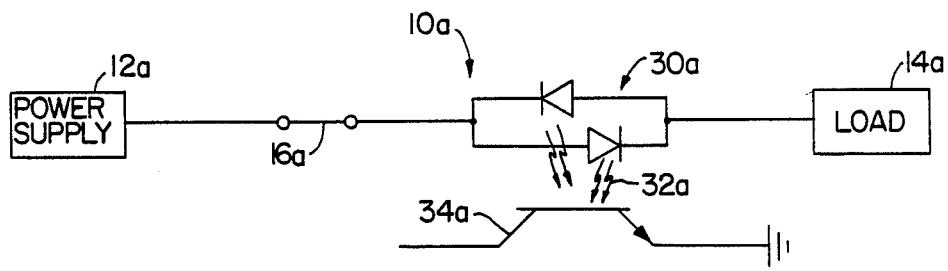
FIG. 1A is a schematic diagram of a portion of an alternative switching system which employs a series LED sensor in the load circuit.

Alternatively, an LED circuit 30a, FIG. 1A, including a pair of LEDs connected in parallel and having reverse polarity may be connected between power supply 12a and load 14a for directly sensing the load current. As long as the load current remains above the level required to drive the LEDs, radiation 32a is emitted to strike phototransistor 34a and maintain the phototransistor in its conducting condition to operate the relay as previously described.

Figure 2:
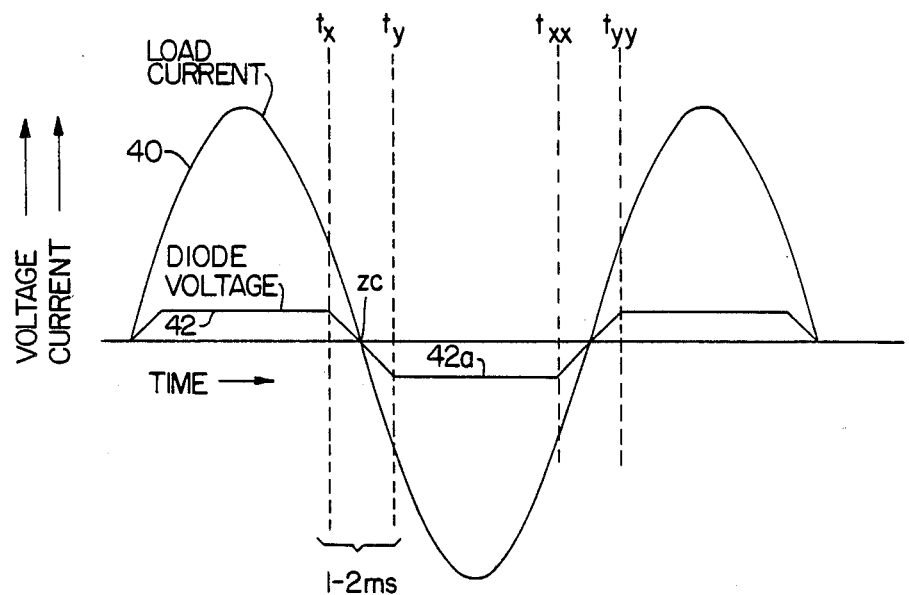
FIG. 2 is a graph which shows variation in load current and diode voltage.

In FIG. 2 the load current waveform 40 has superimposed upon it the voltage waveform 42 across diode circuit 24 of FIG. 1. Waveform 42 also approximates the voltage waveform across LED circuit 30. With the load current above the 20-50 mA level, a 2-volt drop is developed across the diodes and that signal is applied as a drive signal to the LEDs as previously described in connection with FIG. 1. Subsequently, when the load current drops below 20-50 mA at time $t_x$, the diode voltage ramps sharply to zero and remains at zero while load current 40 crosses the zero-current region and until the load current rises in the opposite direction to 20-50 mA at time $t_y$. Typically, diode voltage 42 is at a zero level and phototransistor 34 is in a non-conducting condition for approximately 0.25 to 0.5 millisecond before and after the precise zero-current crossing, e.g. for 0.5 to 1 milliseconds total. When load current 40 again rises above 20-50 mA at time $t_y$, a diode voltage 42a of two volts is again developed across the diodes and phototransistor 34 is switched back to a conducting state as previously described. Subsequently, the phototransistor is switched into a non-conducting state each time load current 40 makes a zero-current crossing, e.g. between times $t_{xx}$ and $t_{yy}$. The phototransistor is sequentially switched on and off in this manner. When switch 20, FIG. 1, is opened, then, during the next zero-current crossing interval, e.g., $t_x$–$t_y$, $t_{xx}$ $t_{yy}$, . . . the coil current ceases entirely, coil 18 is de-energized, and contacts 16 are permitted to open. The load current is lower than 20-50 mA and the danger of arcing is subsequently reduced or eliminated.

Figure 3:
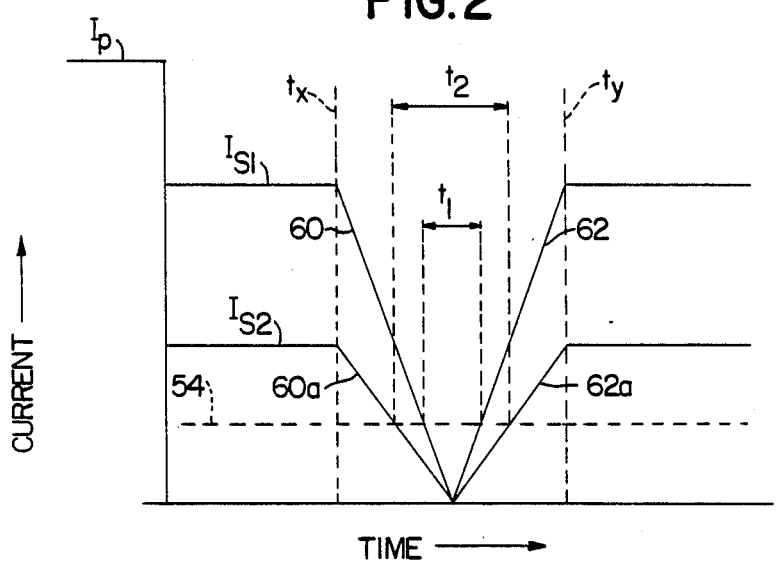
FIG. 3 shows the time variation of the control circuit current at two different levels of maximum current conducted through the secondary switching circuit.

The duration of the zero-current crossing region may be varied, for example, by controlling the value of resistor 38. With switch 20, FIG. 1, open $I_p$ drops to zero, FIG. 3, and relay coil current $I_{s1}$ of 15 mA through transistor 34 follows the path shown in FIG. 3. At time $t_x$ when the diode drive voltage 42, FIG. 2, drops to zero, $I_{s1}$, FIG. 3, decreases rapidly along slope 60, FIG. 3. When $I_{s1}$ reaches threshold level 54 the relay contacts 16 fall open. Subsequently, as the diode voltage rises, $I_{s1}$ increases along slope 62 through threshold 54 to the original level at $t_y$. The zero-current crossing region, the region of little or no arcing, extends for a period $t_1$. By using a resistor 38 of approximately 300 ohms the current $I_{s2}$ is dropped to 7.5 mA and its slopes 60a and 62a are much shallower. This provides a longer period $t_2$ between crossings of threshold level 54. By adjusting the value of resistor 38 the period of zero-crossing can be optimized for the fastest operation consistent with the speed of the relay contact actuation.

Figure 4:
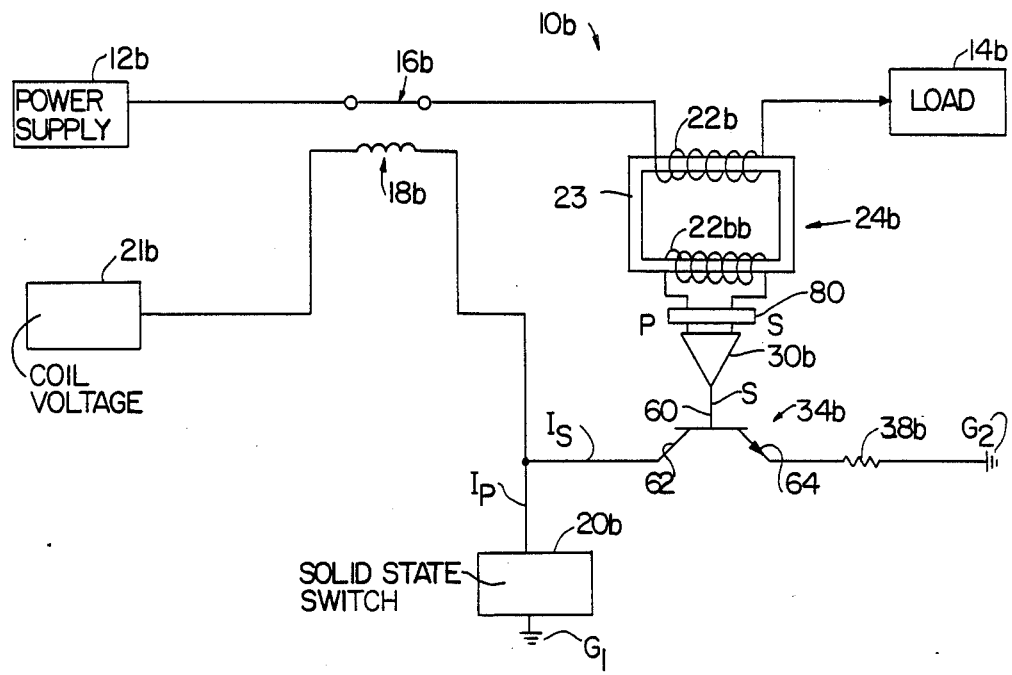
FIG. 4 is a schematic diagram of an alternative zero-current switching circuit employing an induction coil sensor according to this invention.
Figure 4A:
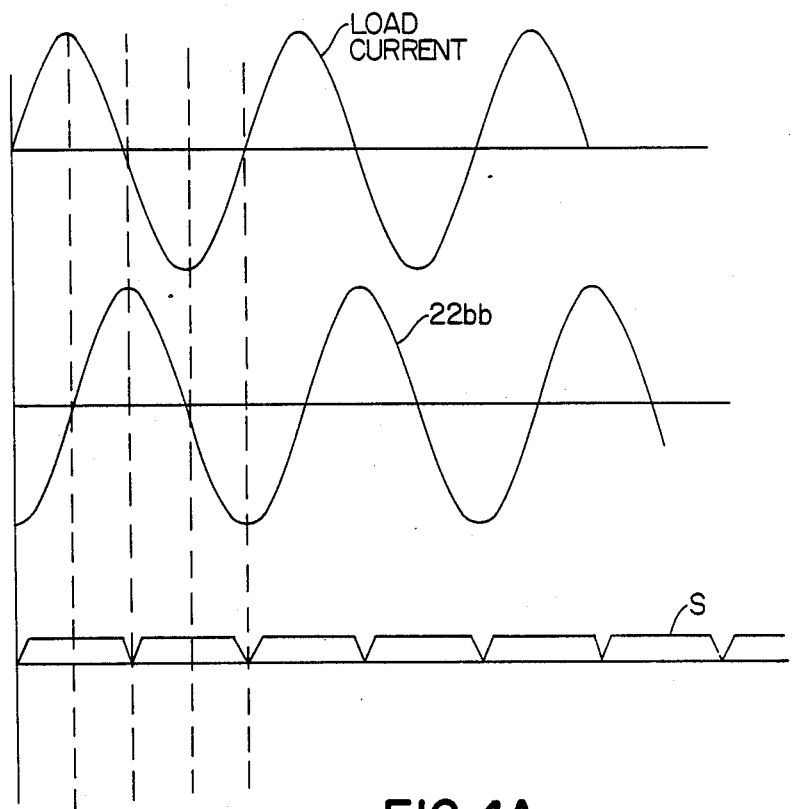
FIG. 4A is a timing chart showing the waveforms in the cascaded sensing coils and the load circuit.

In an alternative preferred embodiment, FIG. 4, an induction circuit 24b, which includes an induction coil 22b a second coil 22bb, and magnetic core 23, develops an output current representative of the load current. The second coil 22bb provides an output which is 90° out of phase with the load current. This 90° phase shift is connected with phase shifting circuit 80. The relationship is depicted in FIG. 4A. The output current is provided to the input of an operational amplifier 30b. The amplifier has an output which is connected to the base 60 of transistor switch 34b. When the load current is at or above the predetermined level of 20–50 mA a threshold output voltage of, for example one volt, is provided by phase shifter circuit 80 to amplifier 30b, which causes the amplifier to provide an actuating signal S to maintain transistor 34b in a conducting condition. The collector 62 of transistor 34b is connected to relay coil 18b and the emitter 64 of the transistor is connected via resistor 38b to ground G2.

In operation, with the alternating load current above the predetermined level, the current induced by coil 22bb is above the threshold level and this causes amplifier 30b to provide actuating signal S which maintains transistor 30b in its conducting condition. When the load current drops below 20–50 mA, the voltage induced by coil 22c drops below its threshold level and amplifier 30b ceases providing signal S to transistor 34b. This switches the transistor to its non-conducting condition. As explained above, as long as switch 20b is closed the momentary non-conduction of transistor 34b is without effect since the two are in parallel. However, after switch 20b is opened the very next zero-crossing cuts off conduction of transistor 34b and with that all current to coil 18b which causes contacts 16b to open without arcing.

Figure 5:
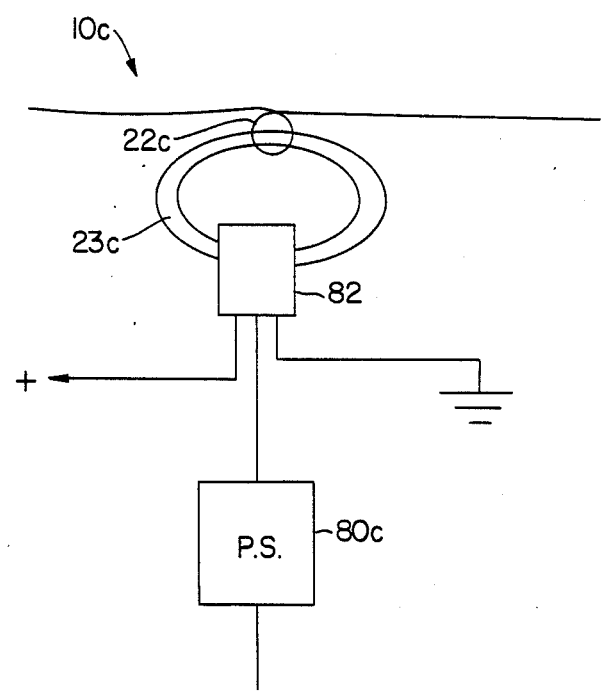
FIG. 5 is a schematic diagram of another alternative zero-current switching circuit employing a Hall effect device.

Alternatively, FIG. 5, a Hall effect device 82 replaces coil 22bb to provide the output to phase shifter 80c.

Although specific features of the invention are shown in some drawings and not in others, this is for convenience only as each feature may be combined with any or all of the other features in accordance with the invention.

Other embodiments will occur to those skilled in the art and are within the following claims;

What is claimed is:

1. A zero-current a.c. switching system for controlling actuation of relay contacts between a power supply and a load comprising:
   means for sensing the load current flowing through the relay contacts to the load;
   primary switching means for selectively energizing the relay to maintain the relay contacts in the closed state; and
   secondary switching means, responsive to said means for sensing, for normally conducting to energize the relay in parallel with said primary switching means, and for ceasing conducting each time the load current drops below a predetermined level to cease energizing the relay and open the relay contacts the next time the load current drops below said predetermined level following the opening of said primary switching means.

2. The switching system of claim 1 in which said means for sensing includes diode means, responsive to a load current of at least said predetermined level, for providing a drive signal and LED means, responsive to said drive signal, for emitting radiation to maintain said secondary switching means in the conducting condition.

3. The switching system of claim 2 in which said diode means includes first and second diodes connected in parallel and with reverse polarity.

4. The switching system of claim 2 in which said LED means includes first and second LEDs connected in parallel and with reverse polarity.

5. The switching system of claim 2 in which said secondary switching means includes semiconductor means, responsive to the radiation from said LED means, for maintaining said conducting condition.

6. The switching system of claim 5 in which said LED means and said semiconductor means are included in an optocoupler.

7. The switching system of claim 1 in which said means for sensing includes LED means, responsive to a load current of at least a said predetermined level, for emitting radiation to maintain said secondary switching means in the conducting condition.

8. The system of claim 7 in which said LED means includes first and second LEDs connected in parallel and with reverse polarity.

9. The system of claim 1 in which said means for sensing includes means for inducing an output current representative of the load current and means, responsive to said means for inducing, for providing an actuating signal.

10. The system of claim 9 in which said means for providing an actuating signal includes amplifier means.

11. The switching system of claim 9 in which said secondary switching means includes semiconductor means, responsive to said actuating signal, for maintaining said conducting condition.

12. The switching system of claim 1 in which said secondary switching means include semiconductor means.

13. The switching system of claim 1 further including impedance means connected to said secondary switching means for controlling the current through said secondary switching means in said conducting condition and for controlling the duration of the zero-current cross over.

14. The switching system of claim 1 in which said primary switching means includes a mechanical switch.

15. The switching system of claim 1 in which said primary switching means includes a solid state switch.

16. The switching system of claim 1 in which said secondary switching means switches repeatedly from said conducting condition to said non-conducting condition at a rate which equals twice the frequency of the load current so that the relay contacts are always ready for virtually instantaneous zero-current switching.

17. A zero-current a.c. switching system for controlling actuation of relay contacts between a power supply and a load comprising:
   diode means, responsive to a load current of at least a predetermined level, for providing a drive signal;
   LED means responsive to said drive signal for emitting radiation;
   primary switching means for selectively energizing the relay to maintain the relay contacts in the closed state; and secondary switching means, including semiconductor means responsive to said emission of radiation from said LED means, for maintaining a conducting condition to energize the relay in parallel with said primary switching means, and for ceasing conducting each time said LED means ceases emitting radiation to cease energizing the relay and open the relay contacts the next time the load current drops below said predetermined level following the opening of said primary switching means.

18. The switching system of claim 17 in which said diode means includes first and second diodes connected in parallel and with reverse polarity.

19. The switching system of claim 17 in which said LED means includes first and second LEDs connected in parallel and with reverse polarity.

20. The switching system of claim 17 in which said LED means and said semiconductor means are included in an optocoupler.

21. The switching system of claim 17 further including resistance means connected to said semiconductor means for limiting the current through said semiconductor means.

22. The switching system of claim 17 in which said primary switching means includes a mechanical switch.

23. The switching system of claim 17 in which said primary switching means includes a solid state switch.

24. The switching system of claim 17 in which said secondary switching means switches repeatedly from said conducting condition to said non-conducting condition at a rate which equals twice the frequency of the load current so that the relay contacts are always ready for virtually instantaneous zero-current switching.

25. A zero-current a.c. switching system for controlling actuation of relay contacts between a power supply and a load comprising:
   means for inducing an output signal representative of the load current;
   means, responsive to said means for inducing, for providing an actuating signal in response to said load current dropping below a predetermined level;
   primary switching means for selectively energizing the relay to maintain the relay contacts in the closed state; and
   secondary switching means, responsive to said actuating signal, for maintaining a conducting condition to energize the relay in parallel with said primary switching means, and for ceasing conducting each time said actuating signal is ceased to de-energize the relay and open the relay contacts the next time the load current drops below said predetermined level following the opening of said primary switching means.

26. The switching system of claim 25 in which said means for providing said actuating signal includes amplifier means.

27. The switching means of claim 25 further including impedance means connected to said secondary switching means for controlling the current conducted through said secondary switching means in the conducting condition and for controlling the duration of the zero-current cross-over.

28. The switching system of claim 25 in which said secondary switching means includes semiconductor means.

29. The switching system of claim 25 in which said primary switching means includes a mechanical switch.

30. The switching system of claim 25 in which said primary switching means includes a solid state switch.

31. The switching system of claim 25 in which said secondary switching means switches repeatedly from said conducting condition to said non-conducting condition at a rate which equals twice the frequency of the load current so that the relay contacts are always ready for virtually instantaneous zero-current switching.

* * * * *